United States Patent
Bobde et al.

(10) Patent No.: US 10,388,781 B2
(45) Date of Patent: Aug. 20, 2019

(54) DEVICE STRUCTURE HAVING INTER-DIGITATED BACK TO BACK MOSFETS

(71) Applicant: Alpha and Omega Semiconductor Incorporated, Sunnyvale, CA (US)

(72) Inventors: Madhur Bobde, Sunnyvale, CA (US); Sik Lui, Sunnyvale, CA (US); Ji Pan, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 222 days.

(21) Appl. No.: 15/161,054

(22) Filed: May 20, 2016

(65) Prior Publication Data
US 2017/0338337 A1    Nov. 23, 2017

(51) Int. Cl.
| | | |
|---|---|---|
| H01L 29/06 | (2006.01) | |
| H01L 29/40 | (2006.01) | |
| H01L 29/78 | (2006.01) | |
| H01L 27/088 | (2006.01) | |
| H01L 21/8234 | (2006.01) | |

(52) U.S. Cl.
CPC .. *H01L 29/7811* (2013.01); *H01L 21/823481* (2013.01); *H01L 21/823487* (2013.01); *H01L 27/088* (2013.01); *H01L 29/0638* (2013.01); *H01L 29/0649* (2013.01); *H01L 29/407* (2013.01); *H01L 29/7803* (2013.01); *H01L 29/7813* (2013.01)

(58) Field of Classification Search
CPC .............. H01L 29/7811; H01L 29/0649; H01L 29/7813; H01L 27/088; H01L 29/0653; H01L 29/0869; H01L 29/4236; H01L 29/4238; H01L 29/41714; H01L 21/823481; H01L 21/76224; H01L 21/76229; H01L 29/407; H01L 29/0638; H01L 29/7803; H01L 21/823487
USPC ........................................................ 257/331
See application file for complete search history.

(56) References Cited

U.S. PATENT DOCUMENTS

| | | | |
|---|---|---|---|
| 4,599,554 A * | 7/1986 | Jaycox ................... | G01R 19/15 323/317 |
| 7,122,882 B2 | 10/2006 | Lui et al. | |
| 7,151,036 B1 | 12/2006 | Goldberger et al. | |
| 7,183,616 B2 | 2/2007 | Bhalla et al. | |
| 7,208,818 B2 | 4/2007 | Luo et al. | |
| 7,221,195 B2 | 5/2007 | Bhalla et al. | |
| 7,285,822 B2 | 10/2007 | Bhalla et al. | |
| 7,335,946 B1 | 2/2008 | Bhalla | |
| 7,355,433 B2 | 4/2008 | Lui et al. | |
| 7,378,884 B2 | 5/2008 | Bhalla et al. | |
| 7,391,100 B2 | 6/2008 | Luo et al. | |
| 7,394,135 B1 * | 7/2008 | Herbert ............... | H01L 29/0856 257/288 |
| 7,436,022 B2 | 10/2008 | Bhalla et al. | |
| 7,443,225 B2 | 10/2008 | Lui et al. | |

(Continued)

*Primary Examiner* — Mohsen Ahmadi
*Assistant Examiner* — Scott E Bauman
(74) *Attorney, Agent, or Firm* — JDI Patent; Joshua D. Isenberg; Robert Pullman

(57) ABSTRACT

A bi-directional switch device includes two inter-digitated back-to-back vertical metal oxide semiconductor field effect transistors (MOSFETs) formed on a substrate with their drains connected together, but otherwise isolated from each other.

20 Claims, 10 Drawing Sheets

(56) References Cited

U.S. PATENT DOCUMENTS

| | | |
|---|---|---|
| 7,453,119 B2 | 11/2008 | Bhalla et al. |
| 7,535,021 B2 | 5/2009 | Bhalla et al. |
| 7,554,839 B2 | 6/2009 | Bobde |
| 7,605,425 B2 | 10/2009 | Bhalla et al. |
| 7,633,119 B2 | 12/2009 | Bhalla et al. |
| 7,633,140 B2 | 12/2009 | Luo et al. |
| 7,659,570 B2 | 2/2010 | Bhalla et al. |
| 7,671,439 B2 | 3/2010 | Pan et al. |
| 7,671,662 B2 | 3/2010 | Lui et al. |
| 7,709,890 B2 * | 5/2010 | Yoshimura ......... H01L 29/0646 257/330 |
| 7,737,522 B2 | 6/2010 | Lui et al. |
| 7,745,878 B2 | 6/2010 | Bhalla et al. |
| 7,755,379 B2 | 7/2010 | Lui et al. |
| 7,764,105 B2 | 7/2010 | Bhalla et al. |
| 7,781,826 B2 | 8/2010 | Mallikarjunaswamy et al. |
| 7,786,531 B2 | 8/2010 | Lui et al. |
| 7,795,987 B2 | 9/2010 | Bobde |
| 7,800,169 B2 | 9/2010 | Bhalla et al. |
| 7,863,675 B2 | 1/2011 | Bhalla et al. |
| 7,863,995 B2 | 1/2011 | Ho et al. |
| 7,868,381 B1 | 1/2011 | Bhalla et al. |
| 7,880,223 B2 | 2/2011 | Bobde |
| 7,923,774 B2 | 4/2011 | Bhalla et al. |
| 7,936,011 B2 | 5/2011 | Bhalla et al. |
| 7,960,233 B2 | 6/2011 | Lui et al. |
| 8,000,124 B2 | 8/2011 | Bobde |
| 8,004,063 B2 | 8/2011 | Goldberger et al. |
| 8,008,716 B2 | 8/2011 | Lui et al. |
| 8,035,159 B2 | 10/2011 | Bhalla et al. |
| 8,053,808 B2 | 11/2011 | Su et al. |
| 8,067,822 B2 | 11/2011 | Luo et al. |
| 8,093,651 B2 | 1/2012 | Bhalla et al. |
| 8,120,142 B2 | 2/2012 | Bobde |
| 8,120,887 B2 | 2/2012 | Mallikarjunaswamy et al. |
| 8,163,618 B2 | 4/2012 | Bhalla et al. |
| 8,169,062 B2 | 5/2012 | Luo et al. |
| 8,174,283 B2 | 5/2012 | Bhalla et al. |
| 8,227,330 B2 | 7/2012 | Pan et al. |
| 8,258,890 B2 | 9/2012 | Bobde |
| 8,283,213 B2 | 10/2012 | Bobde et al. |
| 8,283,723 B2 | 10/2012 | Bhalla et al. |
| 8,288,229 B2 | 10/2012 | Bhalla et al. |
| 8,288,839 B2 | 10/2012 | Guan et al. |
| 8,324,053 B2 | 12/2012 | Bobde et al. |
| 8,324,683 B2 | 12/2012 | Lui et al. |
| 8,324,711 B2 | 12/2012 | Goldberger et al. |
| 8,338,854 B2 | 12/2012 | Bobde et al. |
| 8,338,915 B2 | 12/2012 | Mallikarjunaswamy et al. |
| 8,357,973 B2 | 1/2013 | Lui et al. |
| 8,362,547 B2 | 1/2013 | Bhalla et al. |
| 8,362,552 B2 | 1/2013 | Pan et al. |
| 8,362,585 B1 | 1/2013 | Bhalla et al. |
| 8,367,501 B2 | 2/2013 | Lui et al. |
| 8,372,708 B2 | 2/2013 | Bhalla et al. |
| 8,373,208 B2 | 2/2013 | Bobde et al. |
| 8,390,058 B2 | 3/2013 | Yilmaz et al. |
| 8,394,702 B2 | 3/2013 | Tai et al. |
| 8,431,470 B2 | 4/2013 | Lui et al. |
| 8,431,958 B2 | 4/2013 | Bobde |
| 8,431,989 B2 | 4/2013 | Bhalla et al. |
| 8,441,046 B2 | 5/2013 | Bobde et al. |
| 8,445,370 B2 | 5/2013 | Lui et al. |
| 8,450,794 B2 | 5/2013 | Bhalla et al. |
| 8,455,315 B2 | 6/2013 | Bobde |
| 8,461,644 B2 | 6/2013 | Bobde |
| 8,466,510 B2 | 6/2013 | Guan et al. |
| 8,476,698 B2 | 7/2013 | Guan et al. |
| 8,507,978 B2 | 8/2013 | Bhalla et al. |
| 8,552,527 B2 | 10/2013 | Bobde |
| 8,557,671 B2 | 10/2013 | Guan et al. |
| 8,558,275 B2 | 10/2013 | Bobde |
| 8,558,276 B2 | 10/2013 | Bobde |
| 8,575,685 B2 | 11/2013 | Bobde et al. |
| 8,575,695 B2 | 11/2013 | Bobde et al. |
| 8,580,667 B2 | 11/2013 | Lui et al. |
| 8,586,435 B2 | 11/2013 | Pan et al. |
| 8,597,998 B2 | 12/2013 | Bhalla et al. |
| 8,637,926 B2 | 1/2014 | Lui et al. |
| 8,643,071 B2 | 2/2014 | Pan et al. |
| 8,643,135 B2 | 2/2014 | Bobde et al. |
| 8,669,613 B2 | 3/2014 | Lui et al. |
| 8,680,643 B2 | 3/2014 | Pan et al. |
| 8,692,322 B2 | 4/2014 | Pan et al. |
| 8,698,196 B2 | 4/2014 | Guan et al. |
| 8,710,585 B1 | 4/2014 | Hu et al. |
| 8,710,627 B2 | 4/2014 | Guan et al. |
| 8,728,890 B2 | 5/2014 | Bhalla et al. |
| 8,748,268 B1 | 6/2014 | Pan et al. |
| 8,753,935 B1 | 6/2014 | Bobde et al. |
| 8,759,908 B2 | 6/2014 | Lui et al. |
| 8,785,278 B2 | 7/2014 | Yilmaz et al. |
| 8,785,279 B2 | 7/2014 | Bhalla et al. |
| 8,785,306 B2 | 7/2014 | Guan et al. |
| 8,802,529 B2 | 8/2014 | Yilmaz et al. |
| 8,803,251 B2 | 8/2014 | Lee et al. |
| 8,809,143 B2 | 8/2014 | Bhalla et al. |
| 8,809,948 B1 | 8/2014 | Yilmaz et al. |
| 8,822,300 B2 | 9/2014 | Guan et al. |
| 8,828,857 B2 | 9/2014 | Lui et al. |
| 8,829,603 B2 | 9/2014 | Lui et al. |
| 8,829,614 B2 | 9/2014 | Guan et al. |
| 8,829,640 B2 | 9/2014 | Bobde et al. |
| 8,835,977 B2 | 9/2014 | Bobde et al. |
| 8,859,361 B1 | 10/2014 | Bobde |
| 8,878,292 B2 | 11/2014 | Bobde et al. |
| 8,896,093 B2 | 11/2014 | Mallikarjunaswamy et al. |
| 8,896,131 B2 | 11/2014 | Bhalla et al. |
| 8,900,949 B2 | 12/2014 | Guan et al. |
| 8,907,414 B2 | 12/2014 | Hu et al. |
| 8,907,416 B2 | 12/2014 | Tai et al. |
| 8,927,402 B2 | 1/2015 | Zhu et al. |
| 8,928,079 B2 | 1/2015 | Bhalla et al. |
| 8,933,506 B2 | 1/2015 | Bobde et al. |
| 8,946,816 B2 | 2/2015 | Bobde et al. |
| 8,946,942 B2 | 2/2015 | Lui et al. |
| 8,951,867 B2 | 2/2015 | Lee et al. |
| 8,956,940 B2 | 2/2015 | Lui et al. |
| 8,963,233 B2 | 2/2015 | Bhalla et al. |
| 8,963,240 B2 | 2/2015 | Bhalla et al. |
| 8,969,950 B2 | 3/2015 | Pan |
| 8,975,720 B2 | 3/2015 | Guan et al. |
| 8,980,716 B2 | 3/2015 | Lui et al. |
| 8,981,425 B2 | 3/2015 | Bobde |
| 9,000,481 B2 | 4/2015 | Guan et al. |
| 9,006,053 B2 | 4/2015 | Pan et al. |
| 9,013,848 B2 | 4/2015 | Lui |
| 9,024,378 B2 | 5/2015 | Bhalla et al. |
| 9,048,282 B2 | 6/2015 | Hu et al. |
| 9,059,147 B1 | 6/2015 | Pan et al. |
| 9,082,790 B2 | 7/2015 | Bobde et al. |
| 9,123,805 B2 | 9/2015 | Lui |
| 9,129,822 B2 | 9/2015 | Bhalla et al. |
| 9,136,060 B2 | 9/2015 | Goldberger et al. |
| 9,136,370 B2 | 9/2015 | Lui et al. |
| 9,136,380 B2 | 9/2015 | Yilmaz et al. |
| 9,153,653 B2 | 10/2015 | Padmanabhan et al. |
| 9,166,042 B2 | 10/2015 | Bobde et al. |
| 9,171,917 B2 | 10/2015 | Bobde et al. |
| 9,171,949 B1 | 10/2015 | Padmanabhan et al. |
| 9,190,478 B2 | 11/2015 | Calafut et al. |
| 9,190,512 B2 | 11/2015 | Lee et al. |
| 9,202,938 B2 | 12/2015 | Bobde |
| 9,214,545 B2 | 12/2015 | Tai et al. |
| 9,219,003 B2 | 12/2015 | Lui et al. |
| 9,230,957 B2 | 1/2016 | Lui et al. |
| 9,236,450 B2 | 1/2016 | Bhalla et al. |
| 9,246,347 B2 | 1/2016 | Lui et al. |
| 9,252,264 B2 | 2/2016 | Bobde et al. |
| 9,281,368 B1 | 3/2016 | Lee et al. |
| 9,281,394 B2 | 3/2016 | Yilmaz et al. |
| 9,312,336 B2 | 4/2016 | Pan et al. |
| 9,312,381 B1 | 4/2016 | Bobde et al. |
| 9,318,587 B2 | 4/2016 | Bobde et al. |

(56) References Cited

U.S. PATENT DOCUMENTS

| | | |
|---|---|---|
| 9,324,858 B2 | 4/2016 | Bhalla et al. |
| 9,356,022 B2 | 5/2016 | Lee et al. |
| 2005/0127532 A1 | 6/2005 | Luo et al. |
| 2005/0145996 A1 | 7/2005 | Luo et al. |
| 2005/0224887 A1* | 10/2005 | Matsuki .............. H01L 29/7813 257/368 |
| 2005/0280133 A1 | 12/2005 | Luo et al. |
| 2006/0017141 A1 | 1/2006 | Luo et al. |
| 2006/0091505 A1 | 5/2006 | Lui et al. |
| 2006/0108635 A1 | 5/2006 | Bhalla et al. |
| 2006/0180855 A1 | 8/2006 | Bhalla et al. |
| 2006/0202264 A1 | 9/2006 | Bhalla et al. |
| 2006/0208788 A1 | 9/2006 | Bhalla et al. |
| 2006/0209887 A1 | 9/2006 | Bhalla et al. |
| 2006/0220107 A1 | 10/2006 | Lui et al. |
| 2006/0249785 A1 | 11/2006 | Bhalla et al. |
| 2006/0273379 A1 | 12/2006 | Bhalla et al. |
| 2007/0034901 A1 | 2/2007 | Lui et al. |
| 2007/0073807 A1 | 3/2007 | Bobde |
| 2007/0075392 A1 | 4/2007 | Pan et al. |
| 2007/0096093 A1 | 5/2007 | Bhalla et al. |
| 2007/0182435 A1 | 8/2007 | Lui et al. |
| 2007/0194374 A1 | 8/2007 | Bhalla et al. |
| 2007/0221972 A1 | 9/2007 | Bhalla et al. |
| 2008/0001219 A1 | 1/2008 | Bhalla et al. |
| 2008/0001220 A1 | 1/2008 | Bhalla et al. |
| 2008/0001646 A1 | 1/2008 | Lui et al. |
| 2008/0067584 A1 | 3/2008 | Lui et al. |
| 2008/0079035 A1 | 4/2008 | Bobde |
| 2008/0108202 A1 | 5/2008 | Goldberger et al. |
| 2008/0121988 A1 | 5/2008 | Mallikararjunaswamy et al. |
| 2008/0121995 A1* | 5/2008 | Anderson .............. H01L 29/861 257/356 |
| 2008/0173956 A1 | 7/2008 | Bhalla et al. |
| 2008/0186048 A1 | 8/2008 | Lui et al. |
| 2008/0218922 A1 | 9/2008 | Mallikararjunaswamy et al. |
| 2008/0265289 A1 | 10/2008 | Bhalla et al. |
| 2008/0290367 A1 | 11/2008 | Su et al. |
| 2008/0309382 A1 | 12/2008 | Bhalla et al. |
| 2008/0310065 A1 | 12/2008 | Ho et al. |
| 2008/0310066 A1 | 12/2008 | Bobde |
| 2009/0014853 A1 | 1/2009 | Luo et al. |
| 2009/0039456 A1 | 2/2009 | Bhalla et al. |
| 2009/0045457 A1 | 2/2009 | Bobde |
| 2009/0065814 A1 | 3/2009 | Bhalla et al. |
| 2009/0065855 A1 | 3/2009 | Bhalla et al. |
| 2009/0065861 A1 | 3/2009 | Bhalla et al. |
| 2009/0072301 A1 | 3/2009 | Bhalla et al. |
| 2009/0128223 A1 | 5/2009 | Lui et al. |
| 2009/0166672 A1 | 7/2009 | Bobde |
| 2009/0218619 A1 | 9/2009 | Hebert et al. |
| 2009/0218890 A1 | 9/2009 | Lui et al. |
| 2009/0219044 A1 | 9/2009 | Bhalla et al. |
| 2009/0224316 A1 | 9/2009 | Bhalla et al. |
| 2009/0261883 A1 | 10/2009 | Bobde |
| 2009/0261897 A1 | 10/2009 | Bobde |
| 2010/0090276 A1 | 4/2010 | Bhalla et al. |
| 2010/0148246 A1 | 6/2010 | Bhalla et al. |
| 2010/0155876 A1 | 6/2010 | Pan et al. |
| 2010/0244090 A1 | 9/2010 | Bobde et al. |
| 2010/0258897 A1 | 10/2010 | Lui et al. |
| 2010/0276779 A1 | 11/2010 | Guan et al. |
| 2010/0295152 A1 | 11/2010 | Goldberger et al. |
| 2010/0314682 A1 | 12/2010 | Yilmaz et al. |
| 2010/0314716 A1 | 12/2010 | Mallikararjunaswamy et al. |
| 2010/0321840 A1 | 12/2010 | Bobde |
| 2010/0328830 A1 | 12/2010 | Bobde |
| 2010/0330767 A1 | 12/2010 | Lui et al. |
| 2011/0042724 A1 | 2/2011 | Bhalla et al. |
| 2011/0042727 A1 | 2/2011 | Pan et al. |
| 2011/0042742 A1 | 2/2011 | Bhalla et al. |
| 2011/0049564 A1 | 3/2011 | Guan et al. |
| 2011/0049580 A1 | 3/2011 | Lui et al. |
| 2011/0073906 A1 | 3/2011 | Bobde et al. |
| 2011/0097885 A1 | 4/2011 | Bhalla et al. |
| 2011/0101446 A1 | 5/2011 | Guan et al. |
| 2011/0127577 A1 | 6/2011 | Bobde |
| 2011/0127586 A1 | 6/2011 | Bobde et al. |
| 2011/0127602 A1* | 6/2011 | Mallikarjunaswamy .................... H01L 21/823807 257/331 |
| 2011/0127606 A1 | 6/2011 | Bobde et al. |
| 2011/0176247 A1 | 7/2011 | Goldberger et al. |
| 2011/0204440 A1 | 8/2011 | Bhalla et al. |
| 2011/0204442 A1 | 8/2011 | Guan et al. |
| 2011/0207276 A1 | 8/2011 | Bhalla et al. |
| 2011/0221005 A1 | 9/2011 | Luo et al. |
| 2011/0233666 A1 | 9/2011 | Lui et al. |
| 2011/0233667 A1 | 9/2011 | Tai et al. |
| 2011/0300678 A1 | 12/2011 | Bobde |
| 2012/0007206 A1 | 1/2012 | Bhalla et al. |
| 2012/0018793 A1 | 1/2012 | Bhalla et al. |
| 2012/0025261 A1 | 2/2012 | Bobde et al. |
| 2012/0025301 A1 | 2/2012 | Lui et al. |
| 2012/0068262 A1 | 3/2012 | Pan |
| 2012/0074896 A1 | 3/2012 | Lui et al. |
| 2012/0080751 A1 | 4/2012 | Bhalla et al. |
| 2012/0098058 A1* | 4/2012 | Zhang ............... H01L 29/66734 257/330 |
| 2012/0104555 A1 | 5/2012 | Bobde et al. |
| 2012/0132988 A1 | 5/2012 | Lui et al. |
| 2012/0146090 A1 | 6/2012 | Lui et al. |
| 2012/0146717 A1 | 6/2012 | Bobde |
| 2012/0168900 A1 | 7/2012 | Bobde |
| 2012/0193676 A1 | 8/2012 | Bobde et al. |
| 2012/0199875 A1 | 8/2012 | Bhalla et al. |
| 2012/0211828 A1 | 8/2012 | Bobde et al. |
| 2012/0220092 A1 | 8/2012 | Bobde et al. |
| 2012/0248530 A1 | 10/2012 | Lui et al. |
| 2012/0248566 A1 | 10/2012 | Bobde et al. |
| 2012/0306043 A1 | 12/2012 | Pan et al. |
| 2012/0306044 A1 | 12/2012 | Bobde et al. |
| 2012/0319132 A1 | 12/2012 | Bhalla et al. |
| 2012/0329225 A1 | 12/2012 | Bhalla et al. |
| 2012/0329238 A1 | 12/2012 | Guan et al. |
| 2013/0001683 A1 | 1/2013 | Pan et al. |
| 2013/0001694 A1 | 1/2013 | Guan et al. |
| 2013/0001695 A1 | 1/2013 | Guan et al. |
| 2013/0009242 A1 | 1/2013 | Bhalla et al. |
| 2013/0015550 A1 | 1/2013 | Bhalla et al. |
| 2013/0020635 A1* | 1/2013 | Yilmaz ................. H01L 27/088 257/334 |
| 2013/0020671 A1 | 1/2013 | Lee et al. |
| 2013/0029461 A1 | 1/2013 | Bhalla et al. |
| 2013/0043527 A1 | 2/2013 | Lui et al. |
| 2013/0049102 A1 | 2/2013 | Bobde et al. |
| 2013/0075855 A1 | 3/2013 | Guan et al. |
| 2013/0093001 A1 | 4/2013 | Bhalla et al. |
| 2013/0105886 A1 | 5/2013 | Lui et al. |
| 2013/0126966 A1 | 5/2013 | Lui et al. |
| 2013/0175612 A1 | 7/2013 | Tai et al. |
| 2013/0200451 A1 | 8/2013 | Yilmaz et al. |
| 2013/0203224 A1 | 8/2013 | Pan et al. |
| 2013/0203225 A1 | 8/2013 | Bhalla et al. |
| 2013/0224919 A1 | 8/2013 | Ding et al. |
| 2013/0260522 A1 | 10/2013 | Guan et al. |
| 2013/0277740 A1 | 10/2013 | Guan et al. |
| 2013/0280870 A1 | 10/2013 | Bhalla et al. |
| 2013/0334599 A1 | 12/2013 | Pan et al. |
| 2014/0027781 A1* | 1/2014 | Ryu .................... H01L 29/7811 257/77 |
| 2014/0027841 A1 | 1/2014 | Bhalla et al. |
| 2014/0048846 A1 | 2/2014 | Lui et al. |
| 2014/0054687 A1 | 2/2014 | Pan et al. |
| 2014/0085760 A1 | 3/2014 | Lui |
| 2014/0134825 A1 | 5/2014 | Guan et al. |
| 2014/0138737 A1 | 5/2014 | Bobde et al. |
| 2014/0138767 A1 | 5/2014 | Lui et al. |
| 2014/0151790 A1 | 6/2014 | Lui et al. |
| 2014/0167101 A1 | 6/2014 | Bobde et al. |
| 2014/0167218 A1 | 6/2014 | Mallikarjunaswamy et al. |
| 2014/0175536 A1 | 6/2014 | Lee et al. |
| 2014/0175540 A1 | 6/2014 | Bobde et al. |
| 2014/0179074 A1 | 6/2014 | Pan et al. |

(56) References Cited

U.S. PATENT DOCUMENTS

| | | |
|---|---|---|
| 2014/0225187 A1 | 8/2014 | Bhalla et al. |
| 2014/0227837 A1 | 8/2014 | Bobde et al. |
| 2014/0231963 A1 | 8/2014 | Guan et al. |
| 2014/0235024 A1 | 8/2014 | Pan et al. |
| 2014/0239382 A1 | 8/2014 | Bobde et al. |
| 2014/0239388 A1 | 8/2014 | Lee et al. |
| 2014/0239436 A1 | 8/2014 | Hu et al. |
| 2014/0252494 A1 | 9/2014 | Lui et al. |
| 2014/0264433 A1 | 9/2014 | Hu et al. |
| 2014/0264571 A1 | 9/2014 | Lui et al. |
| 2014/0273417 A1 | 9/2014 | Zhu et al. |
| 2014/0302647 A1 | 10/2014 | Bobde |
| 2014/0319598 A1 | 10/2014 | Bobde |
| 2014/0319604 A1 | 10/2014 | Bhalla et al. |
| 2014/0319605 A1 | 10/2014 | Yilmaz et al. |
| 2014/0319606 A1 | 10/2014 | Bhalla et al. |
| 2014/0332845 A1 | 11/2014 | Bobde et al. |
| 2014/0332882 A1 | 11/2014 | Lui et al. |
| 2014/0332919 A1 | 11/2014 | Guan et al. |
| 2014/0339630 A1 | 11/2014 | Yilmaz et al. |
| 2014/0357030 A1 | 12/2014 | Bhalla et al. |
| 2014/0363930 A1 | 12/2014 | Bobde |
| 2014/0363946 A1 | 12/2014 | Guan et al. |
| 2015/0021682 A1 | 1/2015 | Bobde et al. |
| 2015/0060936 A1 | 3/2015 | Ding et al. |
| 2015/0084117 A1 | 3/2015 | Bobde |
| 2015/0087116 A1 | 3/2015 | Bobde |
| 2015/0115333 A1 | 4/2015 | Bobde et al. |
| 2015/0118810 A1 | 4/2015 | Bobde et al. |
| 2015/0129956 A1 | 5/2015 | Lui |
| 2015/0137225 A1 | 5/2015 | Lui et al. |
| 2015/0137227 A1 | 5/2015 | Bobde et al. |
| 2015/0145037 A1 | 5/2015 | Lee et al. |
| 2015/0162410 A1 | 6/2015 | Padmanabhan et al. |
| 2015/0162777 A1 | 6/2015 | Lui et al. |
| 2015/0171192 A1 | 6/2015 | Pan |
| 2015/0171201 A1 | 6/2015 | Lui et al. |
| 2015/0179750 A1 | 6/2015 | Calafut et al. |
| 2015/0206943 A1 | 7/2015 | Bobde et al. |
| 2015/0279989 A1 | 10/2015 | Bobde et al. |
| 2015/0295495 A1 | 10/2015 | Lui et al. |
| 2015/0311295 A1 | 10/2015 | Lee et al. |
| 2015/0333174 A1 | 11/2015 | Lee et al. |
| 2015/0349101 A1 | 12/2015 | Bobde et al. |
| 2015/0357406 A1 | 12/2015 | Guan et al. |
| 2015/0372129 A1 | 12/2015 | Bhalla et al. |
| 2015/0372133 A1 | 12/2015 | Lui |
| 2015/0380544 A1 | 12/2015 | Yilmaz et al. |
| 2016/0005809 A1 | 1/2016 | Bobde et al. |
| 2016/0013265 A1 | 1/2016 | Yilmaz et al. |
| 2016/0013267 A1 | 1/2016 | Lee et al. |
| 2016/0035721 A1 * | 2/2016 | Takenaka ............... H01L 27/088 257/334 |
| 2016/0043168 A1 | 2/2016 | Ding et al. |
| 2016/0043169 A1 | 2/2016 | Guan et al. |
| 2016/0043192 A1 | 2/2016 | Ding et al. |
| 2016/0056276 A1 | 2/2016 | Zhang et al. |
| 2016/0064551 A1 | 3/2016 | Lee et al. |
| 2016/0087093 A1 | 3/2016 | Bhalla et al. |
| 2016/0087095 A1 | 3/2016 | Padmanabhan et al. |
| 2016/0099307 A1 | 4/2016 | Padmanabhan et al. |
| 2016/0099308 A1 | 4/2016 | Lui et al. |
| 2016/0099325 A1 | 4/2016 | Calafut et al. |
| 2016/0099351 A1 | 4/2016 | Bobde et al. |
| 2016/0118380 A1 | 4/2016 | Lui et al. |
| 2016/0141411 A1 | 5/2016 | Bobde et al. |
| 2016/0148921 A1 | 5/2016 | Mallikarjunaswamy et al. |

* cited by examiner

DEVICE STRUCTURE HAVING INTER-DIGITATED BACK TO BACK MOSFETS

FIELD OF THE DISCLOSURE

This disclosure relates to integrated circuits and more specifically to integrated circuit devices having back-to-back metal oxide semiconductor field effect transistors (MOSFETs).

BACKGROUND OF INVENTION

Metal Oxide Semiconductor Field Effect Transistors (MOSFETs) are semiconductor transistor devices in which a voltage applied to an electrically insulated gate controls flow of current between source and drain. MOSFETs are useful in many power switching applications. In one particular configuration useful in a battery protection circuit module (PCM) two MOSFETs are arranged in a back-to-back configuration with their drains connected together in a floating configuration. FIG. 1A schematically illustrates such a configuration. FIG. 1B shows use of such a device 100 in conjunction with a Battery Protection Circuit Module PCM 102, battery 104, and a load or charger 106. In this example, the gates of the charge and discharge MOSFETs 120 and 130, respectively, are driven independently by a controller integrated circuit (IC) 110. This configuration allows for current control in both directions: charger to battery and battery to load. In normal charge and discharge operation both MOSFETs 120 and 130 are ON (i.e., conducting). During an over-charge or charge over-current condition of the battery 104, the controller IC 110 turns the charge MOSFET 120 off and the discharge MOSFET 130 on. During an over-discharge or discharge over-current condition, the controller IC 110 turns the charge MOSFET 120 on and the discharge MOSFET 130 off.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Introduction

Figure 2A:
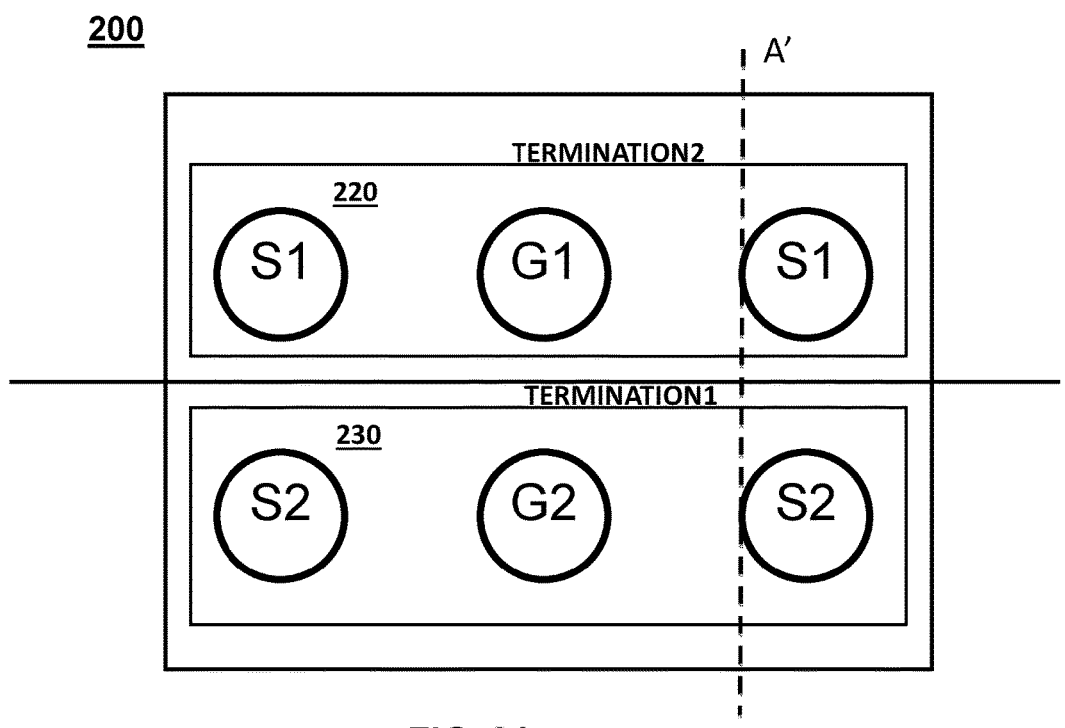
FIG. 2A is a plan view schematic diagram of a conventional switching device having two back-to-back MOSFETs in a side-by-side configuration.

FIG. 2A shows the conventional layout of a device 200 having two fully isolated vertical MOSFETs, 220 and 230, respectively, with a separate termination and channel stop for each of them. A relatively large amount of dead space is required between MOSFET 1 and MOSFET 2 to provide separate termination regions and channel stops to ensure that the two MOSFETs integrated on the same semiconductor substrate are fully isolated. Large chip area used for isolation and channel stop makes it difficult to get closely inter-digitated structure for improving total source to source on resistance RSS.

Figure 2B:
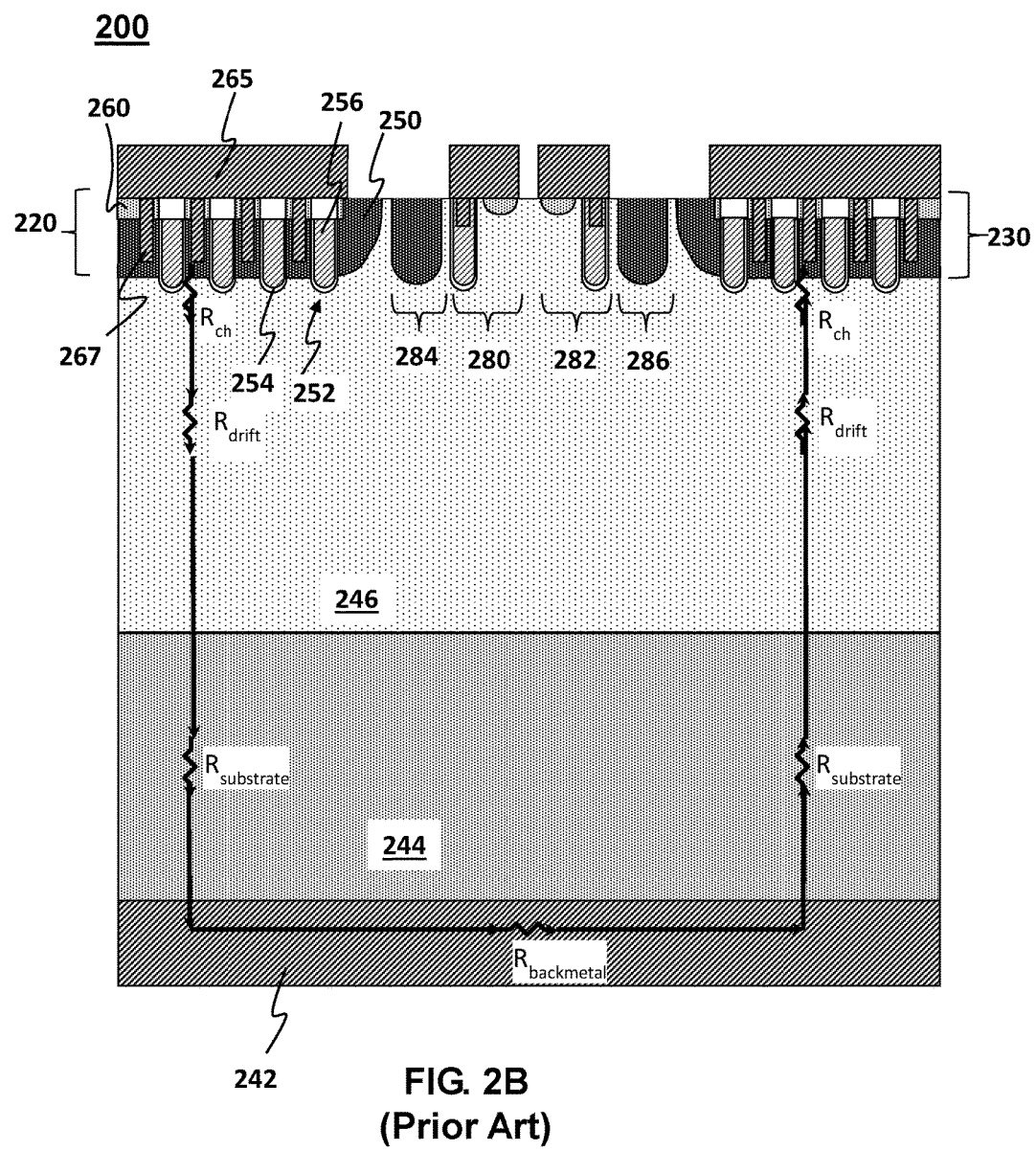
FIG. 2B is a cross-sectional schematic diagram of the conventional switching circuit of FIG. 2A taken along line A-A' of FIG. 2A.

A cross-sectional view of the device 200 of FIG. 2A is shown in FIG. 2B. Each vertical MOSFET 220/230 includes a plurality of active device cells formed in a lightly-doped epitaxial layer 246 grown on a more heavily doped substrate 244. In this example, a heavily doped (e.g., N+) substrate 244 acts as a drain and the drains of the two MOSFETs 220 and 230 are electrically connected via back metal 242 formed on a backside of the substrate 244. Active devices are formed in a lesser doped epitaxial drift layer 246 of the same conductivity type (e.g., N-type) grown on the front side of the substrate 244. Body regions 250 of opposite conductivity to the substrate 244 and epitaxial region 246 (e.g., P-type) are formed in portions of the epitaxial layer 246. Gate trenches 252 are formed in the epitaxial layer 246 and then lined with an insulator 254 (e.g., an oxide). Electrically isolated gate electrodes 256, e.g., made of polycrystalline silicon (polysilicon, also known as poly) are disposed in the trenches 252. Heavily doped (e.g., N+) source regions 260 of the same conductivity type as the substrate 244 are formed proximate the trenches 252. External electrical contact to the source regions is made via a source metal layer 265 and vertical source contacts 267. The channel stops 280, 282 are formed using insulated electrodes similar to the gate electrodes that are shorted to the epitaxial drift region by source-type conductivity regions in the epitaxial region. The termination also includes guard rings 284, 286 formed by body-type conductivity regions.

A key characteristic of the device is the source-to-source resistance with both MOSFETs 220 and 230 turned on. It is desirable to make this resistance as small as possible. The total source-source resistance $R_{ss}$ is given by:

$$R_{ss} = 2R_{ch} + 2R_{drift} + R_{backmetal} + 2R_{substrate},$$

Where $R_{ch}$ is the resistance of the conductive channel through the source 265 and body regions 250 when the gates are turned on, $R_{drift}$ is the resistance of the epitaxial layer 246, $R_{backmetal}$ is the resistance of the back metal 242, and $R_{substrate}$ is the resistance of the substrate 244. If the spacing between MOSFETs 220 and 230 is sufficiently large, the current path from the source metal of one MOSFET 220 to the other 230 is mostly vertical through the channel 252, drift region 246, and substrate 244 and horizontal through the back metal 242. To reduce $R_{ss}$ it is desirable to make the substrate 244 thin and the back metal 242 thick. To reduce the thickness of the substrate 244 it is common to grind the substrate 244 as thin as possible after the fabrication of the devices on the front side. To reduce $R_{substrate}$ and $R_{drift}$, the substrate 244 is no more than 2 mils (about 50 microns) thick and to reduce $R_{backmetal}$ the back metal 242 is at least 8 microns thick. Because of the thinness of the substrate 244, the device 200 shown in FIG. 2A and FIG. 2B is very fragile and subject to breakage. Typically, at least 2 mils of protective tape or mold compound are typically used for mechanical strength. Even with this protection, the yield of usable devices is limited.

Another problem is that a conventional device of the type shown in FIGS. 2A-2B uses a channel stop around each of the two MOSFETs, as shown in FIG. 2B at 280/282. The channel stops 280/282 take up additional space that is not used for active device cells. For a 12-30 V low voltage device, the separation between the active areas of the two MOSFET devices 220, 230 takes up more than 5 microns, typically 10 microns or more. This reduces the area of the channel region, which increases $R_{ss}$.

Inter-Digitation of MOSFETs to Reduce $R_{ss}$

Figure 1A:
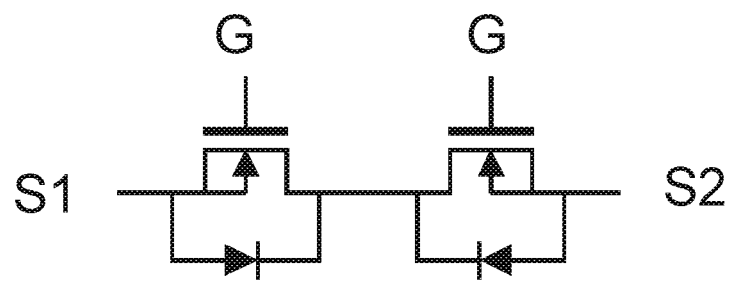
FIG. 1A is a schematic diagram of a conventional switching circuit having two back-to-back MOSFETs.
Figure 1B:
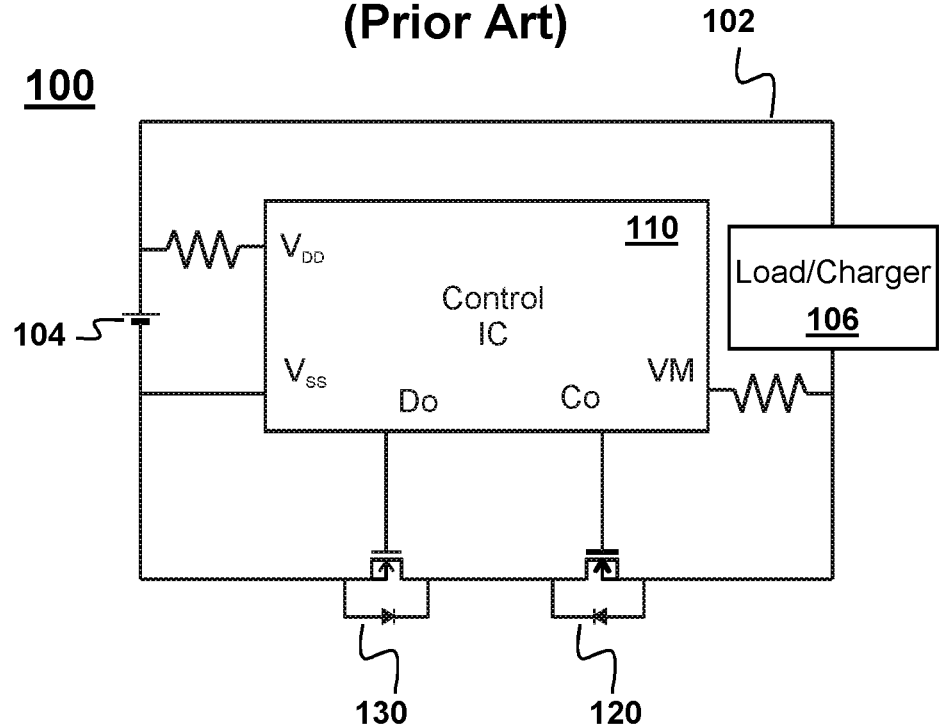
FIG. 1B is a schematic diagram of a conventional battery Protection Circuit Module (PCM).

Aspects of the present disclosure take advantage of certain characteristics of the circuit shown in FIG. 1A and FIG. 1B. For the bi-directional switch used in FIG. 1A and FIG. 1B, the drain is floating. No current flows to or from the device through the drain. For that reason $R_{ss}$ can be optimized reducing the lateral spacing between the two MOSFETs to the point that most of the current flows between them laterally through the drift region. Reducing the lateral spacing provides no benefits if current must flow from outside the device through the drain. Reducing the lateral spacing between the MOSFETs in the bi-directional switch device shown in FIG. 2A while otherwise maintaining the characteristics of the device is somewhat problematic since it would require making the device on a very long and narrow chip. Such a form factor is impractical for most useful applications.

According to aspects of the present disclosure, device structures achieve compact lateral spacing between adjacent isolated vertical MOSFETs with their drains connected together and electrically floating by partitioning the MOSFETs into narrow inter-digitated segments. Inter-digitation of the MOSFETs allows the spacing to be reduced while allowing the device to be manufactured on conventionally sized chip. Inter-digitation has not been done for vertical MOSFETs, though it has been done for lateral MOSFETs. However, lateral MOSFETs have a higher source-drain resistance ($R_{ds-on}$) than vertical MOSFETs, so one would not want to use lateral MOSFETs in a back-to-back configuration, like that shown in FIG. 1A.

Figure 3A:
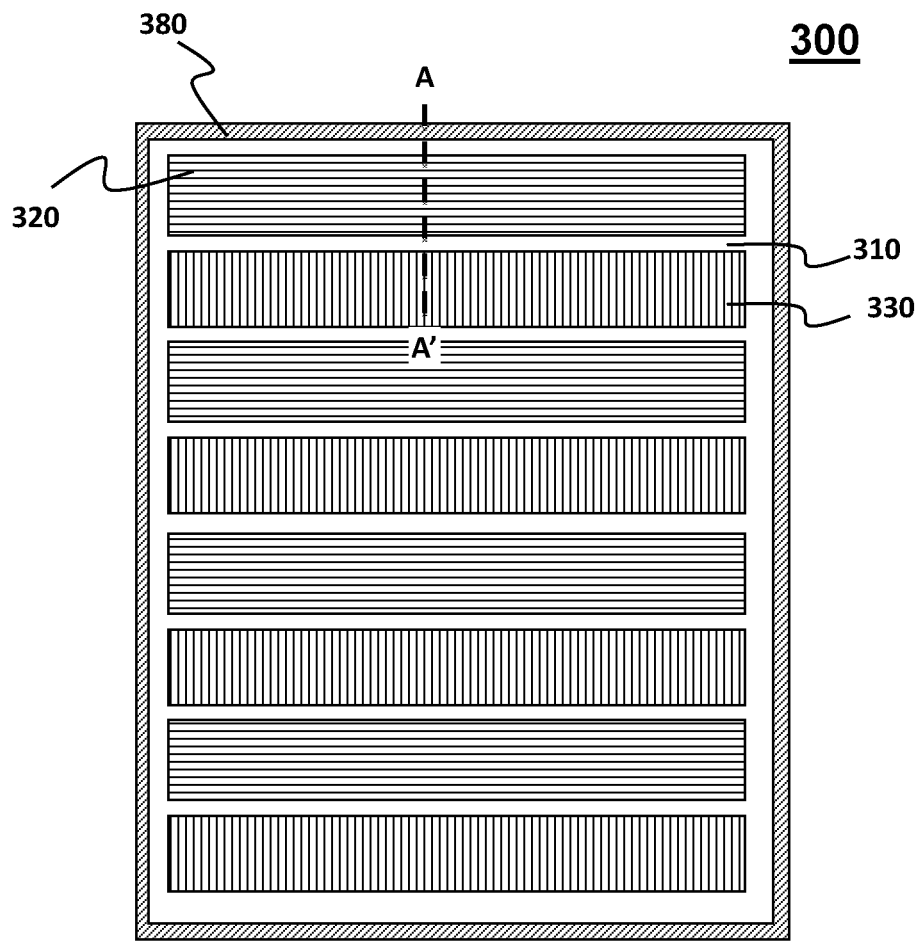
FIG. 3A is a plan view schematic diagram of a switching device having two inter-digitated back-to-back MOSFETs in accordance with an aspect of the present disclosure.

FIG. 3A illustrates an example of a switching device 300 having two inter-digitated back-to-back MOSFETs according to aspects of the present disclosure. In the illustrated example, first and second MOSFETs 320 and 330, respectively, are made up of inter-digitating isolated segments that are separated from each other by a short distance. If the separation between segments is made sufficiently small, most of the current flow is through the drift region over a short lateral distance instead of a much longer vertical distance. By way of example, and not by way of limitation, the drift region (e.g., corresponding to epitaxial layer 246) may be between 0.5 μm and 5 μm thick. Furthermore, making the separation between segments sufficiently small can eliminate the vertical flow through the substrate and the back metal. By making the current flow mostly lateral through the drift region, the vertical flow through the substrate and the lateral flow through the back metal become negligible. Therefore, there is no need to back-grind the substrate or make the back metal too thick. With the inter-digitated bi-directional switch design of FIG. 3A-FIG. 3B the substrate 244 can be 3 to 6 mils (roughly 75 to 150 microns) thick and with as little as no back metal 242 at all. Eliminating the back-grinding and back metal eliminates for extra processing and improves chip stability, both of which improve yield and reduce cost.

Figure 3B:
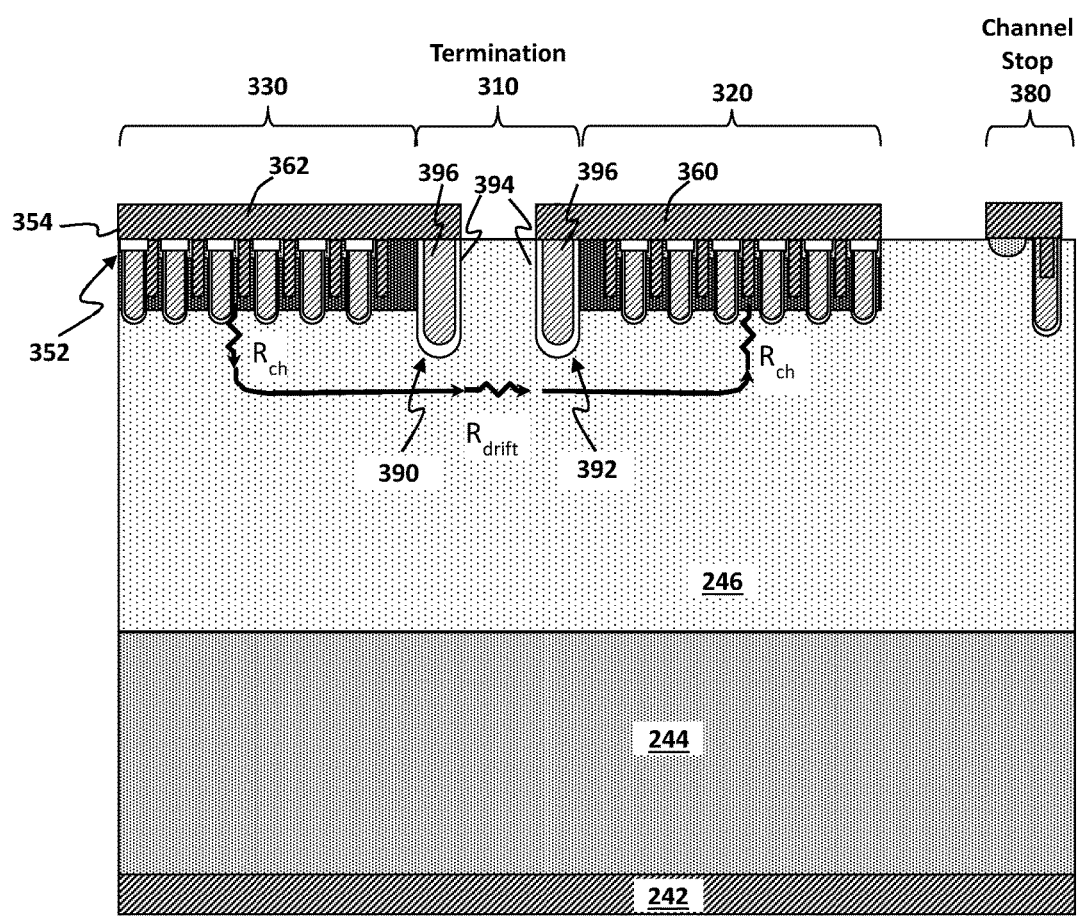
FIG. 3B is a cross-sectional schematic diagram of the switching device of FIG. 3A taken along line A-A' of FIG. 3A.

In the example shown in FIG. 3A-FIG. 3B, the die on which the MOSFETs 320, 330 are formed is rectangular. In alternative implementations, the die may be of any other suitable shape. For rectangular die, the dimensions of the longest side may range from about 500 μm to about 5 mm and the aspect ratio (length to width ratio) may range from about 1 to about 3.

As a practical matter, the interdigitated segments are connected to electrically isolated source metal regions that also inter-digitate. The two source metal regions are formed, e.g., by patterning a metal layer, e.g., with an etch process. With the novel isolation designs shown in FIG. 3B-FIG. 3D between the two MOSFETs 320/330, Separation of 5 microns or less between the two MOSFETs 320/330 can be readily achieved, which may be also determined by the metal-to-metal spacing for the two source metal regions. The nature of the etch process that patterns the metal layer limits metal-to-metal spacing. For example, existing metal etch processes may limit the metal-to-metal spacing to no less than about 1 micron.

The number of active device cells each segment can accommodate depends on the segment pitch, the cell pitch within each segment, and the inter-metal spacing between the segments of the first and second MOSFETs. The inter-metal spacing may range from about 1 μm to about 5 μm. The segment pitch may range from about 10 μm to about 100 μm. By way of example, and not by way of limitation, for a segment pitch of 25 microns and inter-metal spacing of 5 microns the segment width is 22.5 microns (μm). For a cell pitch of 1 micron roughly 22 cells can fit in each segment. The number of segments depends on the length of the die on which the bi-directional switch is fabricated. The cell pitch may range from 0.5 μm to 2 μm.

Aspects of the present disclosure can also eliminate the channel stop trenches and contacts and multiple guard rings in between the MOSFETs 220/230 shown in FIG. 2B. In place of these structures, an interdigitated device may use a shallow trench isolation and termination 310 between adjacent MOSFET segments. A channel stop 380 is only needed for isolation from the edge of the chip.

FIG. 3B shows an example in which the guard rings 284/286 of FIG. 2B are eliminated and the two MOSFETs 320 and 330 are isolated by deeper trenches 390/392 that are formed in the epitaxial layer 246 and lined with relatively thicker insulator 394 (e.g., oxide) and filled with conductive material 396 (e.g., polysilicon). The insulator 394 is thicker than the insulator 354 lining the gate trenches 352. The conductive material 396 in the isolation trench 392 around MOSFET 1 320 is electrically isolated from the gate electrode in the active gate trenches. In one embodiment the conductive material 396 in the isolation trench 392 around MOSFET 1 320 is connected to the source metal 360 for MOSFET 1. Likewise, the conductive material in the isolation trench 390 for MOSFTET 2 330 is electrically isolated from the gate electrode in the active gate trenches. In one embodiment the conductive material 396 in the isolation trench 390 around MOSFET 2 330 is connected to the source metal 362 for MOSFET 2. The isolation trenches 390/392 may be about 0.5 to 2 microns deep for 12-30 V devices. Body doped regions may reach the outer sidewall of the isolation trenches 390/392 but no source region disposed adjacent the isolation trenches 390/392 The separation between the two MOSFETs 320/330, as measured from the edge of the active area, can be reduced to 5 microns or less.

Figure 3C:
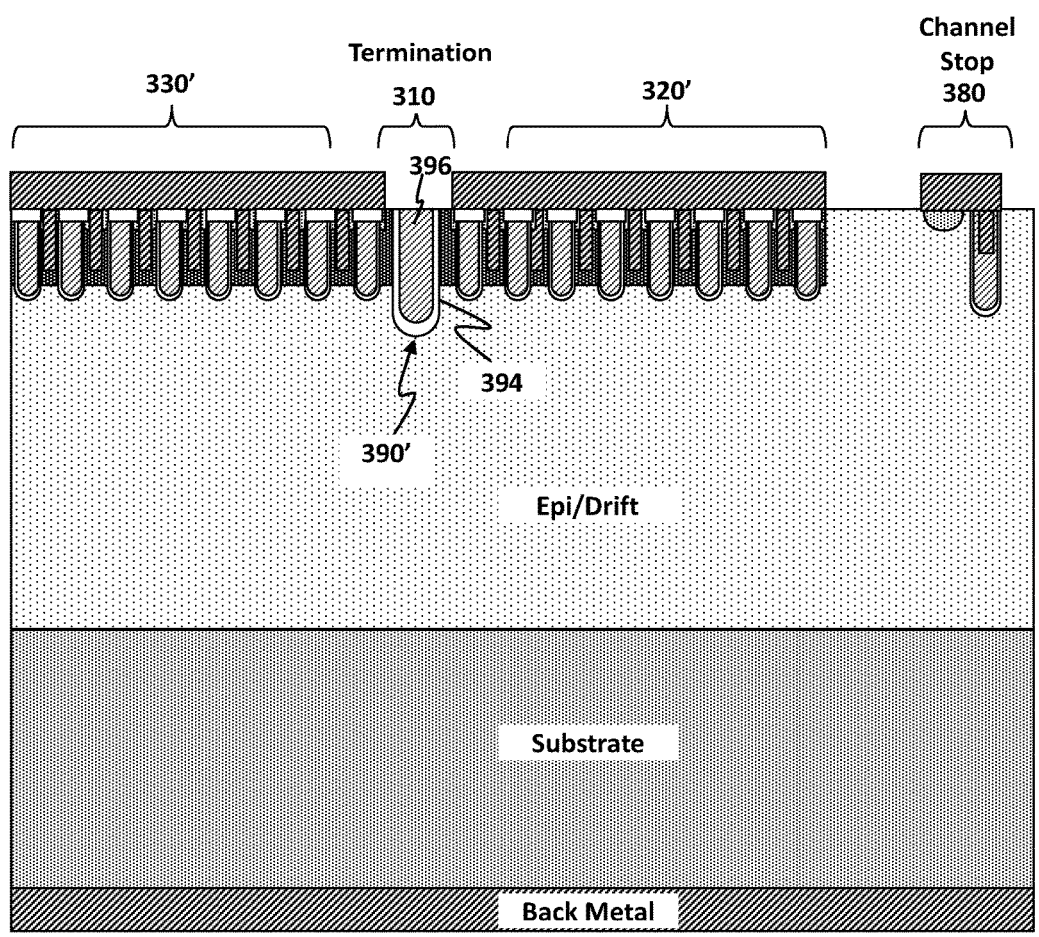
FIG. 3C is a cross-sectional schematic diagram of an alternative switching device having two inter-digitated back-to-back MOSFETs in accordance with an aspect of the present disclosure.
Figure 3D:
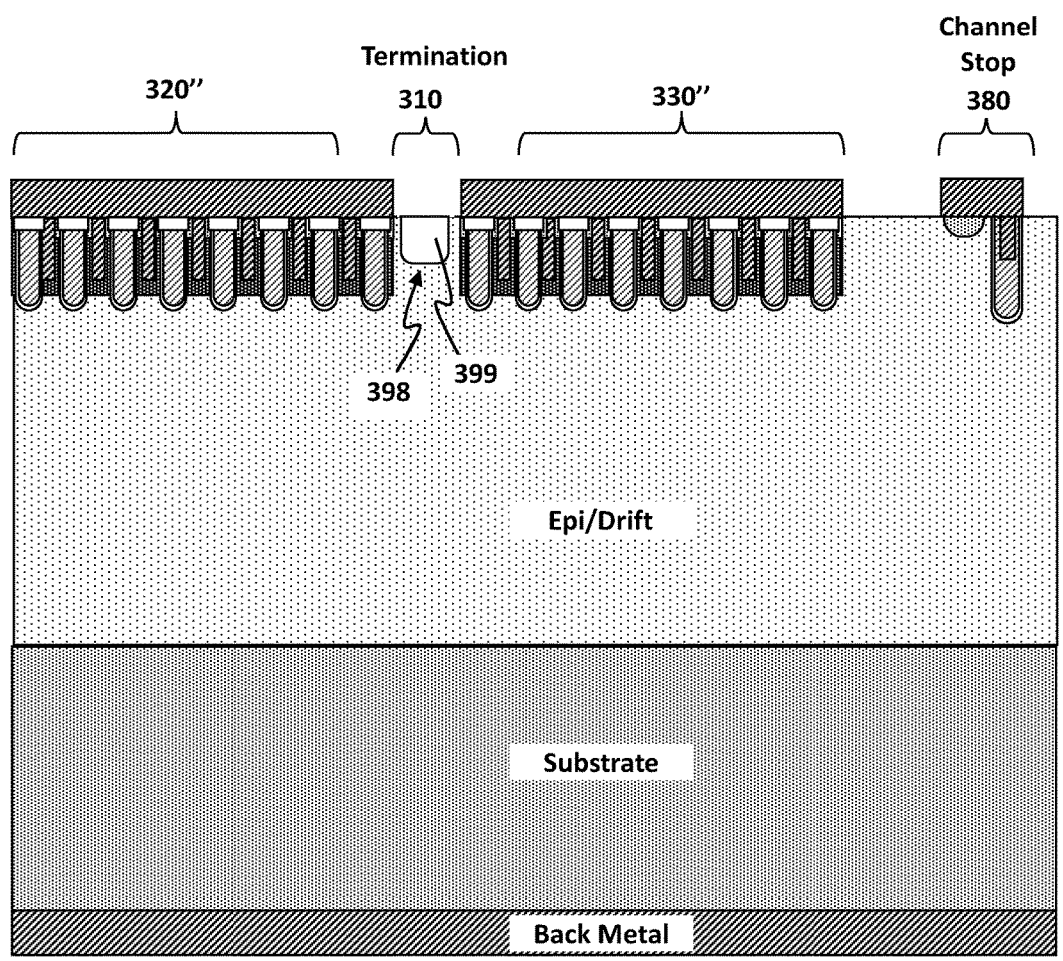
FIG. 3D is a cross-sectional schematic diagram of another alternative switching device having two inter-digitated back-to-back MOSFETs in accordance with an aspect of the present disclosure.

In an alternative implementation shown in FIG. 3C, MO 320' and MOSFET2 330' are isolated by a single isolation trench 390' that is lined with insulating material that isolates an electrically conductive material 396 that is electrically floating. In the illustrated example, the trench 390' is lined with relatively thick insulator 394 and is filled with conductive material 396, such as polysilicon. The separation between the two MOSFETs 320'/330' can be reduced below 5 microns. In another alternative implementation shown in FIG. 3D, MOSFET1 320" and MOSFET2 330" are isolated by a single shallow trench 398 that is filled with insulator 399, such as an oxide. This configuration omits the polysilicon completely and instead uses an oxide filled trench. The separation between the two MOSFETs 320"/330" can be reduced below 5 microns. The processing for manufacturing the configuration shown in FIG. 3D requires an additional step to fill the single shallow trench 398 with insulator 399 though.

Figure 4A:
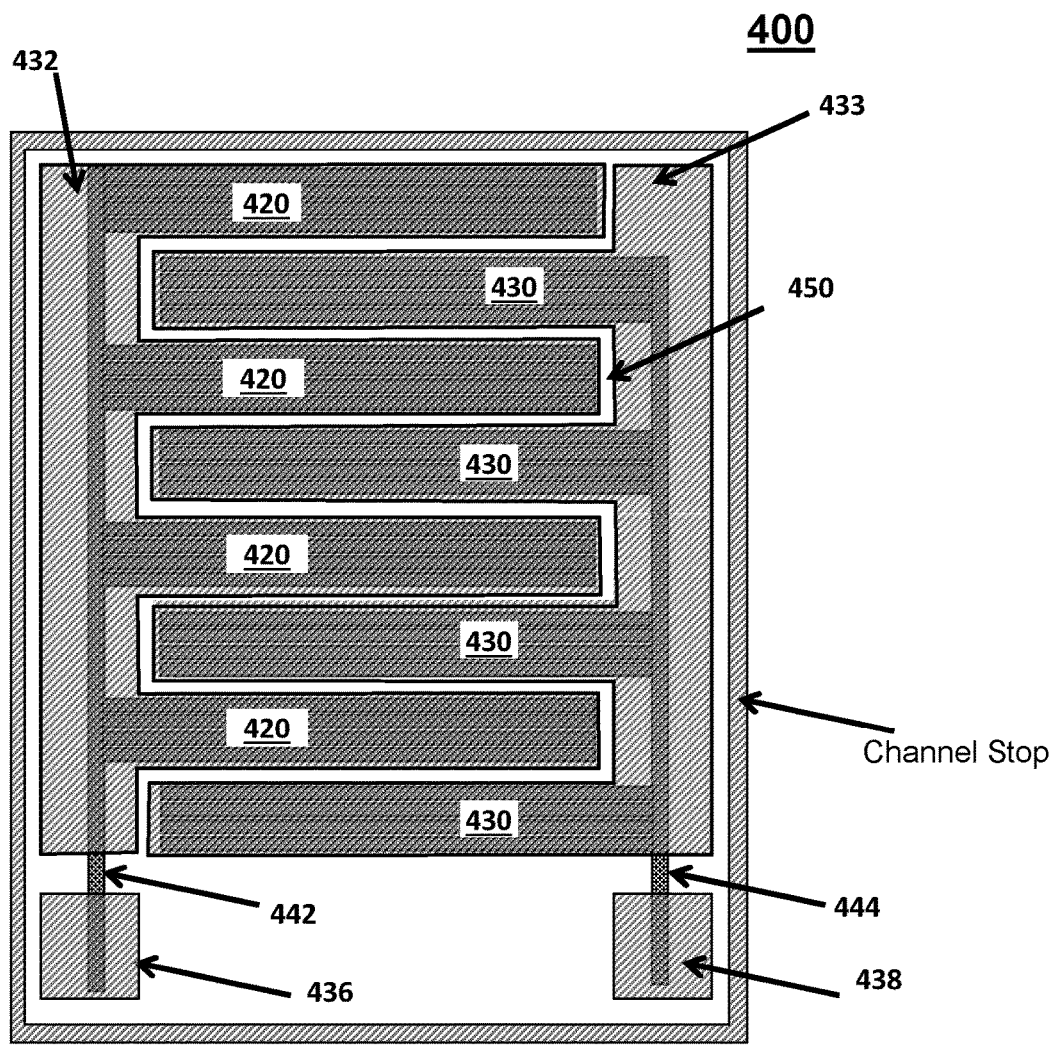
FIG. 4A is a plan view schematic diagram of a switching device having two inter-digitated back-to-back MOSFETs having one metal layer in accordance with an aspect of the present disclosure.

FIG. 4A shows one example of a layout for a bi-directional switch device 400 having two inter-digitated MOSFETs that uses a single metal layer to provide separate electrical contacts to the sources of both MOSFETs 420 and 430, isolated by compact isolation 450 of this invention. The single metal layer is divided into two isolated portions 432 and 433 that respectively cover interdigitated segments of the two MOSFETs 420 and 430 and one or more gate pads 436 and 438. Contact openings provide vertical electrical connection between metal portions and the active cells of the corresponding segments. Additional contact openings vertically connect the gate pads 436 and 438 to conductive gate runners 442 and 444, respectively, disposed in insulation-lined gate runner trenches under the source metals 432 and 433. The gate runners 442 and 444 are in turn connected to the gate electrodes of the active cells in gate trenches running in parallel under the active areas of the two MOSFETs 420 and 430, respectively.

Figure 4B:
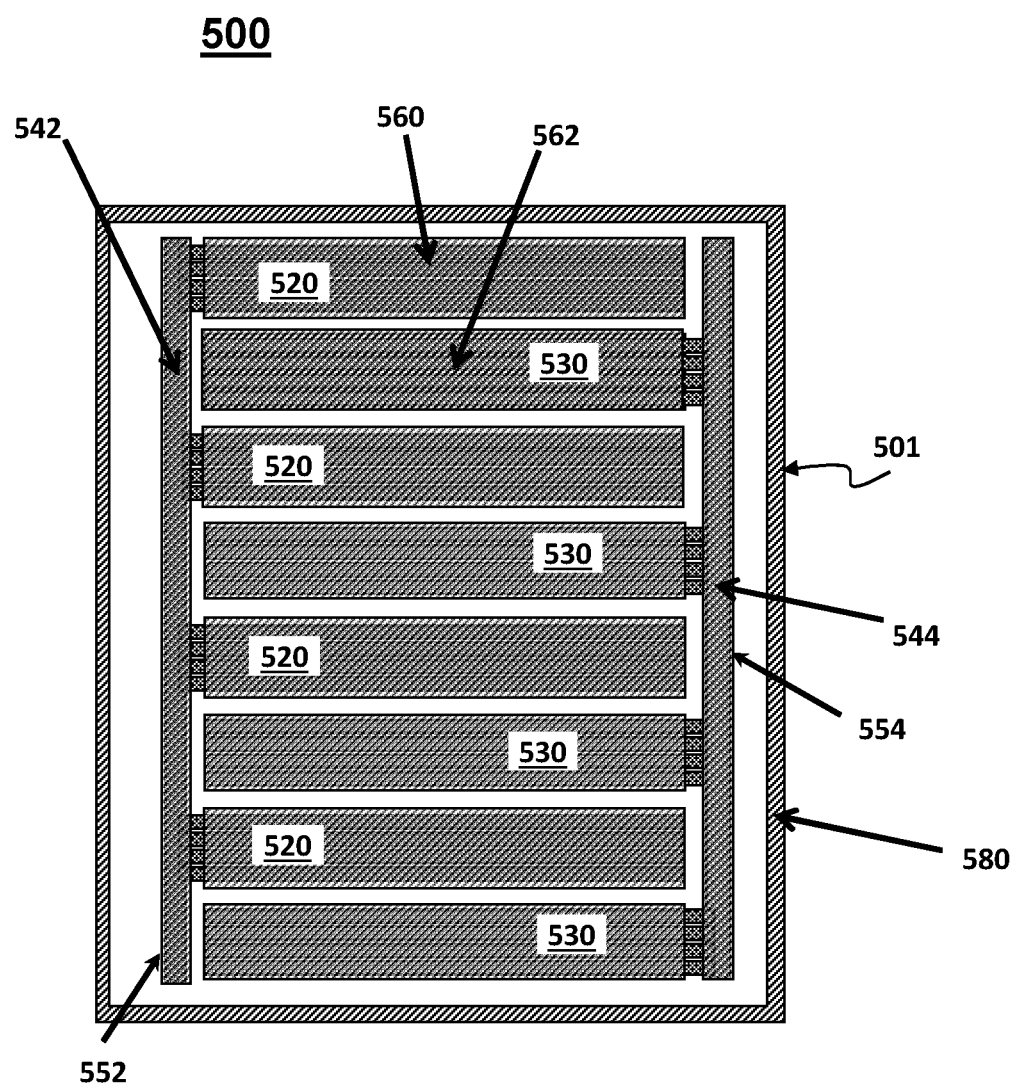
FIGS. 4B-4C are plan view schematic diagrams of a switching device having two inter-digitated back-to-back MOSFETs having two metal layers in accordance with an aspect of the present disclosure.
Figure 4C:
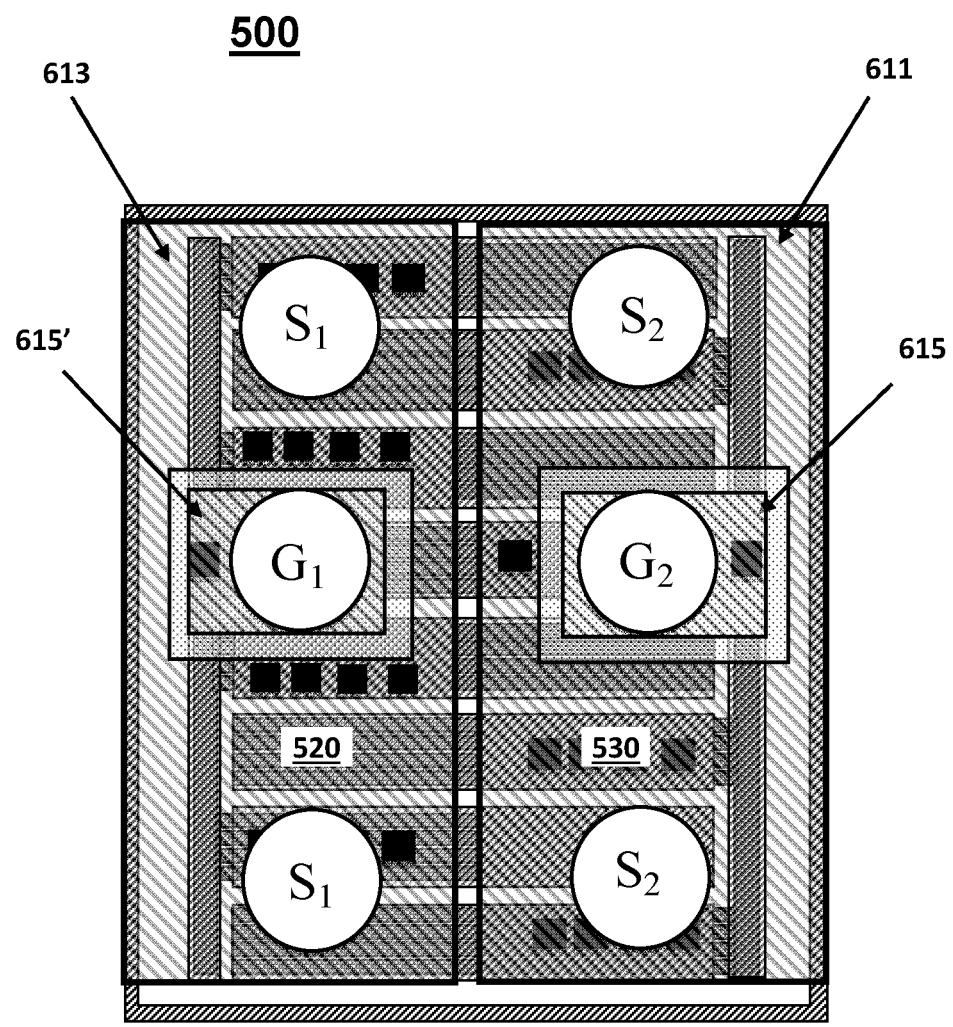

The single metal layer configuration of FIG. 4A may result in a significant area of the device chip being unusable for active cells. To make more efficient use of the available chip real estate for active cells, a two-metal layer may be used. FIGS. 4B-4C illustrate an example of layout for a bi-directional switch having such a two metal layer configuration. FIG. 4B shows a plan view layout of the switch showing the configuration of a first metal layer and certain features of the first and second MOSFETs 520 and 530 such as the gate runners 542 and 544 respectively connected to each insulated gate electrode in gate trenches running in parallel in each first and second MOSFETs 520 and 530 areas, and a channel stop 580 at the edge of the chip 501 on which the switch 500 is made. The first metal layer is divided into isolated sections 560 and 562 that overly the inter-digitated segments containing the active cells of the first and second MOSFETs 520 and 530. Each of these metal segments 560 and 562 is connected to corresponding source regions respectively, by conductive plugs, e.g., as shown and described above. The first metal layer is further divided into additional isolated gate runner metal sections 552 and 554 that respectively overly the gate runners 542 and 544 for the first and second MOSFETs 520 and 530. Another section of the first metal layer overlies the channel stop 580.

FIG. 4C shows the plan of the second metal layer overlaid on top of FIG. 4B. The first and second metal layers are isolated from each other by a layer of dielectric material (not shown) that is sandwiched between them. The second metal layer is divided into four isolated sections (611, 613, 615 and 615') that allow for external contact for the gates and sources of the first and second MOSFETS 520 and 530. Each of these sections is connected to the corresponding portions of the first metal layer by conductive vias formed through the dielectric material layer. The two gate pads 615 and 615' are similarly connected to the corresponding gate pads or gate runner metal sections formed by the first metal layer by conductive vias formed through the dielectric material layer. Solder balls may be formed on respective isolated sections of the second metal layer for flip chip connection to the circuit board application. The two-metal configuration allows for a more compact arrangement of the gate pads and source metal regions and more efficient use of the available real estate on the chip for active device cells.

Aspects of the present disclosure allow for a compact and efficient bi-directional switch design that can be manufactured without requiring back-grinding or back metal.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f).

What is claimed is:

1. A bi-directional switch device, comprising:
   a semiconducting substrate;
   two inter-digitated back-to-back vertical metal oxide semiconductor field effect transistors (MOSFETs) formed on the substrate, with their drains connected together, but otherwise isolated from each other, wherein each of the two inter-digitated back-to-back vertical MOSFETs has a number of active cells with one or more active gate trenches, wherein a pitch of a plurality of segments corresponding to two inter-digitated back-to-back vertical MOSFETs is selected such that a source-to-source current path between the two inter-digitated back-to-back MOSFETs is predominantly lateral current flow in a drift region of the two MOSFETs; and
   a termination structure formed between the two MOSFETs having one or more trenches, each in a size different from that of each of one or more active gate trenches in the active cells in the two MOSFETs.

2. The device of claim 1, wherein the two inter-digitated back-to-back vertical MOSFETs include a first vertical MOSFET having a plurality of segments, and a second vertical MOSFET having one or more segments, wherein the one or more segments of the second vertical MOSFET includes a segment disposed between two segments of the plurality of segments of the first vertical MOSFET.

3. The device of claim 2, wherein a pitch of the plurality of segments of the first vertical MOSFET is between 10 µm and 100 µm.

4. The device of claim 2, wherein a thickness of the semiconducting substrate is greater than 75 microns.

5. The device of claim 2, wherein a thickness of the semiconducting substrate is between 3 mils and 6 mils.

6. The device of claim 2, wherein a width of each segment of the plurality of segments in the first and second MOSFETs is between 500 µm and 5 mm.

7. The device of claim 2, wherein each segment of the first and second MOSFETs has between 10 and 200 active cells.

8. The device of claim 1, further comprising an electrically isolated metal layer formed on the substrate, wherein gate and source regions of the two inter-digitated back-to-back MOSFETs are electrically connected to corresponding isolated portions of the metal layer.

9. The device of claim 1, further comprising an electrically isolated metal layer formed on the substrate, wherein source regions of the two inter-digitated back-to-back MOSFETs are electrically connected to corresponding isolated and inter-digitated portions of the metal layer.

10. The device of claim 9, wherein gate regions of the two inter-digitated back-to-back MOSFETs are electrically connected to separate corresponding isolated gate pad portions of the metal layer.

11. The device of claim 1, further comprising a first electrically isolated metal layer formed on the substrate and a second electrically isolated metal layer formed on a layer of insulating material sandwiched between the first metal layer and the second metal layer, wherein source regions of the two inter-digitated back-to-back MOSFETs are electrically connected to corresponding isolated and inter-digitated portions of the first metal layer and the corresponding isolated and inter-digitated portions of the first metal layer are electrically connected to corresponding electrically isolated portions of the second metal layer by conductive vias formed through the layer of an insulating material sandwiched between the first metal layer and the second metal layer.

12. The device of claim 11, wherein gate regions of the two inter-digitated back-to-back MOSFETs are electrically connected to corresponding isolated gate portions of the first metal layer and the corresponding isolated gate portions of the first metal layer are electrically connected to corresponding electrically isolated gate pad portions of the second metal layer by conductive vias formed through the layer of insulating material sandwiched between the first metal layer and the second metal layer.

13. The device of claim 1, wherein the one or more trenches in the termination structure extend deeper in depth than the active gate trenches and are lined with an insulating material thicker than that for the active gate trenches.

14. The device of claim 13, wherein the termination structure includes a single trench filled with an insulator material.

15. The device of claim 1, wherein the one or more trenches in the termination structure are shallower in depth than the active gate trenches and is only filled with an insulating material.

16. The device of claim 1, wherein the one or more trenches in the termination structure is a single trench which extends deeper in depth than the active gate trenches and is lined with an insulating material thicker than that for the active gate trenches.

17. The device of claim 1, further comprising a channel stop formed around the first and second inter-digitated MOSFETs.

18. The device of claim 1, wherein a backside of the substrate has no metal layer formed on it.

19. A bi-directional switch device, comprising:
a semiconducting substrate;
a first vertical metal oxide semiconductor field effect transistor (MOSFET) formed on the substrate, the first vertical metal oxide semiconductor field effect transistor having a first source region, a first gate region disposed on a first top portion of the substrate and a first drain disposed on a first bottom portion of the substrate, a first source metal electrically connected to the first source region;
a second vertical MOSFET formed on the substrate, the second vertical metal oxide semiconductor field effect transistor comprises a second source region, a second gate region disposed on a second top portion of the substrate and a second drain disposed on a second bottom portion of the substrate, a second source metal electrically connected to the second source region, wherein each of the first and second vertical MOSFETs has a number of active cells with one or more active gate trenches; and
an isolation structure comprising at least a trench between the first and second MOSFETs, wherein each of the at least a trench is in a size different from that of each of one or more active gate trenches in the active cells in the first and second MOSFETs, wherein the first and second drains are electrically connected together, the first source and the first gate are electrically isolated from the second source and the second gate respectively thus forming two back-to-back MOSFETs, wherein a source-to-source current path between the two back-to-back MOSFETs is predominantly lateral current flow in a drift region of the two MOSFETs.

20. The device of claim 19, wherein a separation between the two MOSFETs is 5 micron or less.

* * * * *